United States Patent
Wang

(10) Patent No.: US 10,693,366 B2
(45) Date of Patent: Jun. 23, 2020

(54) PFC CONVERTER CONTROL METHOD, INVERTER HOUSEHOLD APPLIANCE, AND PFC CONVERTER CONTROL METHOD FOR AN INVERTER HOUSEHOLD APPLIANCE

(71) Applicants: Hisense Home Appliances Group Co., Ltd., Foshan, Guangdong (CN); HISENSE (GUANGDONG) AIR CONDITIONER CO., LTD., Jiangmen, Guangdong (CN)

(72) Inventor: Bin Wang, Guangdong (CN)

(73) Assignees: Hisense Home Appliances Group Co., Ltd., Foshan, Guangdong (CN); HISENSE (GUANGDONG) AIR CONDITIONER CO., LTD., Jiangmen, Guangdong (CN)

(*) Notice: Subject to any disclaimer, the term of this patent is extended or adjusted under 35 U.S.C. 154(b) by 0 days.

(21) Appl. No.: 16/217,863

(22) Filed: Dec. 12, 2018

(65) Prior Publication Data

US 2019/0123637 A1  Apr. 25, 2019

Related U.S. Application Data

(63) Continuation of application No. PCT/CN2016/105782, filed on Nov. 14, 2016.

(30) Foreign Application Priority Data

Jun. 12, 2016 (CN) .......................... 2016 1 0412431

(51) Int. Cl.
*H02M 1/44* (2007.01)
*G01R 19/175* (2006.01)
(Continued)

(52) U.S. Cl.
CPC ............. *H02M 1/44* (2013.01); *G01R 19/175* (2013.01); *H02M 1/12* (2013.01); *H02M 1/4208* (2013.01);
(Continued)

(58) Field of Classification Search
CPC ........ H02M 1/44; H02M 1/12; H02M 1/4208; H02M 7/48; H02M 2001/0009; G01R 19/175; Y02B 70/126
See application file for complete search history.

(56) References Cited

U.S. PATENT DOCUMENTS

| 2011/0110126 A1 | 5/2011 | Morrish |
| 2017/0187292 A1* | 6/2017 | Schaemann ............ G01R 23/02 |

FOREIGN PATENT DOCUMENTS

| CN | 102594118 A | 7/2012 |
| CN | 102857087 A | 1/2013 |

(Continued)

OTHER PUBLICATIONS

International Search Report and Written Opinion of the International Search Authority dated Mar. 15, 2017 in International Application No. PCT/CN2016/105782 (English and German languages) (10 pp.).

(Continued)

*Primary Examiner* — Jue Zhang
(74) *Attorney, Agent, or Firm* — Brinks Gilson & Lione

(57) ABSTRACT

The present disclosure provides a PFC converter control method, an inverter household appliance and a PFC converter control method for an inverter household appliance, where the method includes: controlling the PFC converter to generate a frequency offset function where frequency offset value periodically varies with time, superimposing the frequency offset function on a carrier reference frequency of the PFC converter to obtain a periodically varying PFC (Continued)

carrier frequency function; detecting a phase of a voltage of an alternating current of an electrical grid, and controlling a PFC carrier frequency corresponding to each frequency point of the PFC carrier frequency function to periodically vary with the phase of the voltage of the alternating current of the electrical grid, which effectively reduces an amplitude of the highest interference power spectrum detected during a test process, and achieves the purpose of reducing the level of electromagnetic interference in the high frequency PFC technology.

15 Claims, 4 Drawing Sheets

(51) Int. Cl.
*H02M 1/12* (2006.01)
*H02M 1/42* (2007.01)
*H02M 7/48* (2007.01)
*H02M 1/00* (2006.01)

(52) U.S. Cl.
CPC ...... *H02M 7/48* (2013.01); *H02M 2001/0009* (2013.01); *Y02B 70/126* (2013.01)

(56) References Cited

FOREIGN PATENT DOCUMENTS

| | | |
|---|---|---|
| CN | 103607112 A | 2/2014 |
| CN | JP 2014117017 A | 6/2014 |
| CN | 104852584 A | 8/2015 |
| CN | 105591535 A | 5/2016 |
| CN | 105958814 A | 9/2016 |

OTHER PUBLICATIONS

First Office Action received from the State Intellectual Property Office of People's Republic of China for Application No. 201610412431.8 dated Jan. 17, 2018 (Chinese language only) (5 pp.).

* cited by examiner

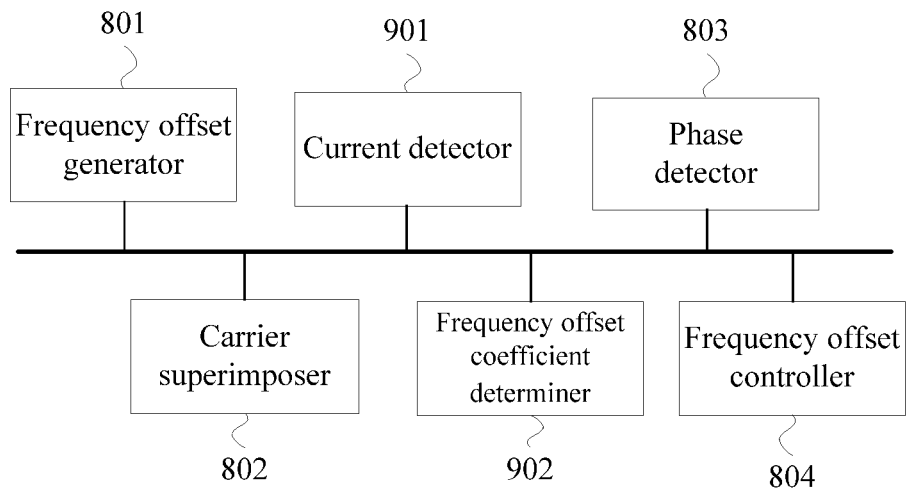

FIG. 9

Generating, by the inverter household appliance, a PFC carrier frequency function based on a carrier reference frequency of an PFC converter, wherein the PFC carrier frequency function is periodically varying, and a variation of the PFC carrier frequency function is a periodically triangular wave variation — 1001

Detecting, by the inverter household appliance, a phase of a voltage of an alternating current of an electrical grid — 1002

Controlling, by the inverter household appliance, a PFC carrier frequency of the PFC converter to vary with the phase of the voltage according to the PFC carrier frequency function — 1003

FIG. 10

PFC CONVERTER CONTROL METHOD, INVERTER HOUSEHOLD APPLIANCE, AND PFC CONVERTER CONTROL METHOD FOR AN INVERTER HOUSEHOLD APPLIANCE

CROSS-REFERENCE TO RELATED APPLICATIONS

This application is a continuation of the International Application No. PCT/CN2016/105782, filed on Nov. 14, 2016, entitled "PFC CONVERTER CONTROL METHOD, APPARATUS AND FREQUENCY VARIATION ELECTRIC APPLIANCE", which claims priority to Chinese Patent Application No. 201610412431.8, filed on Jun. 12, 2016, entitled "PFC CONVERTER CONTROL METHOD, APPARATUS AND FREQUENCY VARIATION ELECTRIC APPLIANCE", both of the aforementioned patent applications are hereby incorporated by reference in their entireties.

TECHNICAL FIELD

The present application relates to the technical field of household appliance control, and in particular, to a Power Factor Correction (PFC) converter control method, an inverter household appliance and a PFC converter control method for an inverter household appliance.

BACKGROUND

The PFC technology can vary a power factor of a frequency variation controller, or reduce the harmonic current existing in the frequency variation product, thereby reducing the harm caused by the harmonic current. In related art, the software high-frequency PFC technology based on single-chip microcomputer has been widely used, in which, carrier modulation technology using a fixed carrier frequency makes the generated interference spectrum mainly distributing near the higher harmonic frequency of the carrier frequency.

SUMMARY

In a first aspect, a PFC converter control method provided by some embodiments of the present application includes:
controlling a PFC converter to generate a frequency offset function, where a frequency offset value corresponding to the frequency offset function periodically varies with time;
superimposing the frequency offset function on a carrier reference frequency of the PFC converter to obtain a periodically varying PFC carrier frequency function;
detecting a phase of a voltage of an alternating current of an electrical grid; and
controlling the PFC carrier frequency corresponding to each frequency point of the PFC carrier frequency function to periodically vary with the phase of the voltage of the alternating current of the electrical grid.

In a second aspect, an inverter household appliance provided by some embodiments of the present application includes a frequency offset generator, a carrier superimpose, a phase detector, and a frequency offset controller, which are all coupled each other through a bus, where:
the frequency offset generator is configured to control a PFC converter to generate a frequency offset function, where a frequency offset value corresponding to the frequency offset function periodically varies with time;
the carrier superimposer is configured to superimpose the frequency offset function on a carrier reference frequency of the PFC converter to obtain a periodically varying PFC carrier frequency function;
the phase detector is configured to detect a phase of a voltage of an alternating current of an electrical grid; and
the frequency offset controller is configured to control a PFC carrier frequency corresponding to each frequency point of the PFC carrier frequency function to periodically vary with a phase of the voltage of the alternating current of the electrical grid.

In a third aspect, a PFC converter control method for an inverter household appliance provided by some embodiments of the present application includes:
generating, by the inverter household appliance, a PFC carrier frequency function based on a carrier reference frequency of an PFC converter, wherein the PFC carrier frequency function is periodically varying, and a variation of the PFC carrier frequency function is a periodically triangular wave variation;
detecting, by the inverter household appliance, a phase of a voltage of an alternating current of an electrical grid; and
controlling, by the inverter household appliance, a PFC carrier frequency of the PFC converter to vary with the phase of the voltage according to the PFC carrier frequency function.

BRIEF DESCRIPTION OF DRAWINGS

FIG. 9 is another principle schematic diagram of an inverter household appliance provided by some embodiments of the present application;
and
FIG. 10 is a schematic flow diagram of a PFC converter control method for an inverter household appliance provided by some embodiments of the present application.

DESCRIPTION OF EMBODIMENTS

Figure 1:
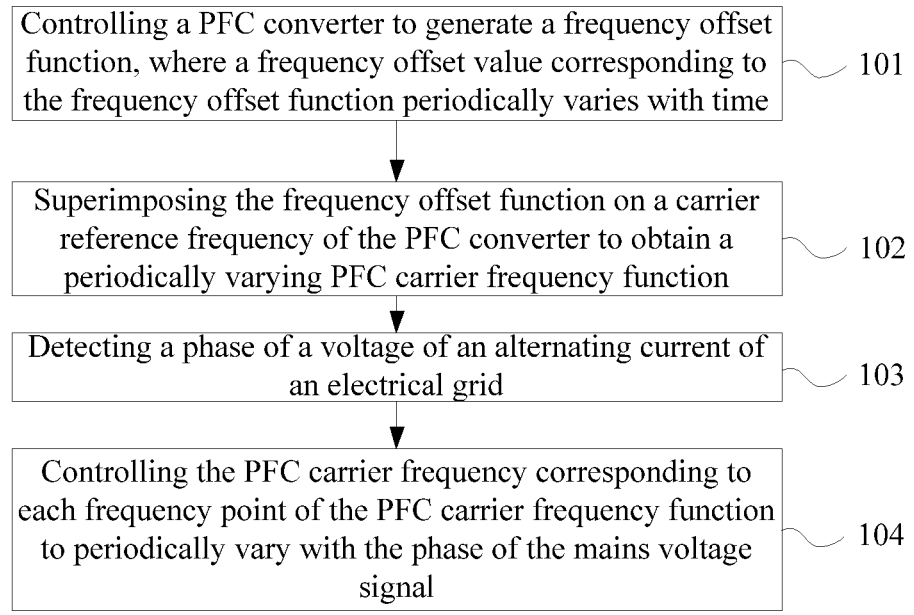
FIG. 1 is a schematic flow diagram of a PFC converter control method provided by some embodiments of the present application.

In order to make the purpose, technical solution and advantages of the embodiments of the present application more clear, the technical solutions in the embodiments of the present application are clearly and completely described in the following with reference to the accompanying drawings in the embodiments of the present application. Apparently, the described embodiments are only some rather than all of the embodiments of the present application. All other embodiments obtained by a person of ordinary skill in the art without resorting to inventive effort based on the embodiments of the present application are within the scope of the present application.

In a frequency controller of a frequency variation electric appliance, a PFC circuit is a key circuit, which can improve a power factor of the frequency controller, to achieve the requirements of harmonic current in international standards, thereby a frequency controller can effectively reduce damages to an electrical grid and other electric appliances caused by harmonic current in a voltage of an alternating current of an electrical grid. With advancement of power semiconductor device technology and performance improvement of single-chip microcomputers, the high-frequency PFC technology based on single-chip microcomputers (software control) has been widely used, which realizes miniaturization of the frequency controller and is a new green environmental protection technology. The active PFC circuit with high power factor and small harmonic current, has become a mainstream PFC application circuit.

It is well known that carrier modulation produces severe electric magnetic interference (EMI), which is due to electromagnetic radiation and electromagnetic conduction interference caused by the large changes as dv/dt and di/dt in the modulation process. It cost a lot to reduce such interference.

In high-frequency PFC technology, the electromagnetic radiation and the power spectrum of the electromagnetic conduction interference are directly related to the carrier frequency, based on the hardware, the related art varies the parameter of the fixed carrier frequency, so that the carrier frequency jitters about the carrier reference frequency. For example, in the power switching control chip, the frequency jittering function switch is added, and is controlled by hardware technology to switch on and switch off. When the frequency jittering function switch is switched on, a fixed frequency offset is superimposed on the carrier reference frequency, and when the frequency jittering function switch is switched off, the original carrier reference frequency is used, to achieve that the carrier frequency jitters about the carrier reference frequency, thus effectively widening the power spectrum of the electromagnetic interference, reducing the maximum amplitude of the interference power spectrum, and reducing the electromagnetic radiation and electromagnetic conduction interference level of the high frequency PFC.

However, the use of fixed carrier frequency control renders the interference spectrum concentrating near the higher harmonic frequency of the carrier frequency, resulting in a concentrated power spectral, a higher peak power spectral density, and more serious electromagnetic interference.

FIG. 1 is a schematic flow diagram of a PFC converter control method provided by some embodiments of the present application. The executive entity of the method embodiment is a PFC converter controller, also called an inverter household appliance. As shown in FIG. 1, the PFC converter control method provided by the method embodiment includes:

Step 101: controlling a PFC converter to generate a frequency offset function, where a frequency offset value corresponding to the frequency offset function periodically varies with time.

The PFC converter is controlled by the inverter household appliance to generate a frequency offset function that periodically varies with time through a function expression, where an amplitude of the frequency offset function represents frequency offset values at different time points, and it periodically varies, and can be adjusted in real time. However, a power spectrum amplitude, a maximum power spectral density, and a power spectrum shape of the frequency offset value corresponding to the frequency offset function generated by the function expression may be respectively different from those of a frequency offset value corresponding to the frequency offset function generated by a different function expression. Some embodiments of the present application do not limit the specific expression of the frequency offset function.

Step 102: superimposing the frequency offset function on a carrier reference frequency of the PFC converter to obtain a periodically varying PFC carrier frequency function.

In some embodiments of the present application, by superimposing the frequency offset function generated above on the carrier reference frequency of the PFC converter, in a real-time, periodically varying carrier frequency function can be obtained, which is called PFC carrier frequency function in some embodiments of the present application, where the PFC carrier frequency value corresponding to the PFC carrier frequency function periodically varies about the carrier reference frequency. The carrier reference frequency is used as a fixed carrier frequency in the related art.

Figure 2:
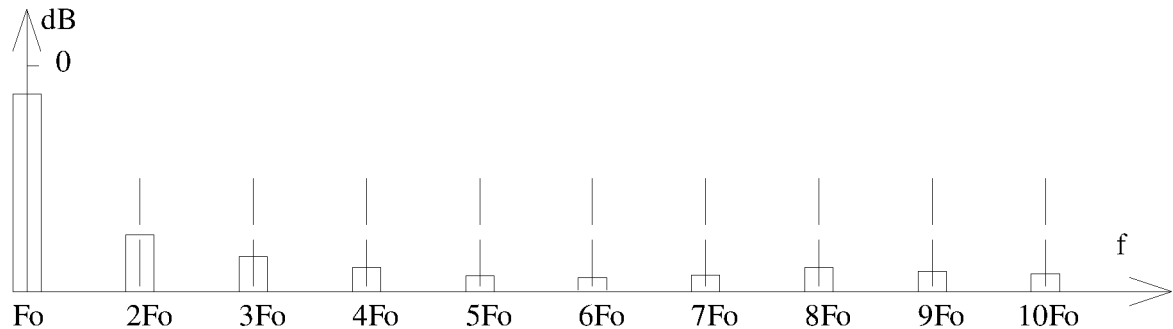
FIG. 2 is a schematic diagram showing a power spectrum distribution of each harmonic component of an electromagnetic interference signal generated with a fixed carrier frequency in the related art.
Figure 3:
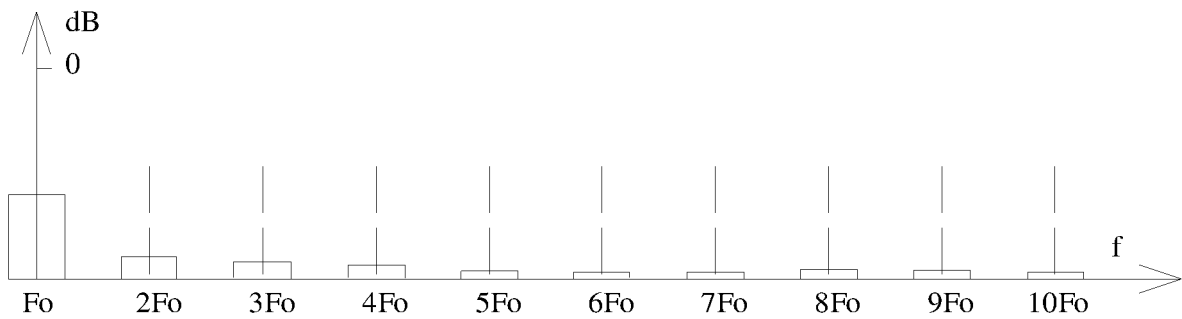
FIG. 3 is a schematic diagram of a power spectrum distribution of each harmonic component of an interference spectrum when a PFC carrier frequency corresponding to a PFC carrier frequency function is used in some embodiments of the present application.

FIG. 2 is a schematic diagram showing a power spectrum distribution of each harmonic component of an interference spectrum when a carrier with a fixed carrier frequency is used in the related art, and FIG. 3 is a schematic diagram of a power spectrum distribution of each harmonic component of an interference spectrum when a PFC carrier frequency corresponding to a PFC carrier frequency function is used in some embodiments of the present application.

When a carrier with a fixed carrier frequency is used for modulation, the interference spectrum generated by the PFC circuit after carrier modulation includes a harmonic component with a fixed carrier frequency. The distribution diagram of the harmonic component with the fixed carrier frequency is shown in FIG. 2, where the fundamental wave ($F_0$) and higher harmonics ($2F_0, \ldots, 10F_0$, etc.) are included. Because the carrier frequency is fixed, its harmonic power spectrum is relatively concentrative, making a higher peak of the power spectral density. However, when the PFC carrier frequency corresponding to the PFC carrier frequency function is used for modulation, the spectral width at the fundamental wave ($F_0$) of the PFC carrier frequency is significantly broadened. For example, the spectral width of $F_0$ in FIG. 3 is larger than that of $F_0$ in FIG. 2, and since a total power of the same harmonic is substantially unchanged, the peak power amplitude decreases inversely while the spectrum is broadened, as shown in FIG. 3. Therefore, with a comparison between FIG. 2 and FIG. 3, by changing the carrier frequency of the modulated signal, the purpose of widening the electromagnetic harmonic frequency spectrum width and reducing the power spectral density is achieved, and the EMC effect is improved.

The larger the frequency offset value corresponding to the frequency offset function is, and the larger the PFC carrier frequency variation of the PFC carrier frequency function corresponding to the frequency offset function is, which leads to a wider frequency spectrum width, a lower effective harmonic power spectral density, and a more obvious effect of suppressing electromagnetic interference.

Step 103: detecting a phase of a voltage of an alternating current of an electrical grid, and Step 104: controlling the PFC carrier frequency corresponding to each frequency point of the PFC carrier frequency function to periodically vary with the phase of the voltage of the alternating current of the electrical grid.

The narrower the pulse width is, the more the harmonic signals will be generated. Hereinafter, the narrow pulse introduced in some embodiments of the present application includes both a narrow on-pulse and a narrow off-pulse. In order to effectively increase the width of the pulse, in some embodiments of the present application, according to the phase characteristics of the voltage of the alternating current of the electrical grid, by controlling the PFC carrier frequency corresponding to each frequency point of the PFC carrier frequency function periodically vary with the phase of the voltage of the alternating current of the electrical grid, that is, by controlling the frequency offset value corresponding to the frequency offset function to control the PFC carrier frequency value of the PFC carrier frequency function, the minimum frequency point and the maximum frequency point of the PFC carrier frequency function correspond to the narrow pulse generation points, respectively.

The PFC converter control method provided by some embodiments of the present application, by controlling the PFC converter to generate a frequency offset function where a frequency offset value periodically varies with time, superimposing the frequency offset function aforementioned on the carrier reference frequency of the PFC converter, to obtain a periodically changing PFC carrier frequency function, detecting a phase of the voltage of the alternating current of the electrical grid, and controlling the PFC carrier frequency corresponding to each frequency point of the PFC carrier frequency function to periodically vary with the phase of the voltage of the alternating current of the electrical grid, not only effectively reduces the maximum interference power spectrum amplitude generated by the PFC converter, but also achieves the purpose of reducing both the electromagnetic radiation and the electromagnetic conduction interference level of the high frequency PFC.

In the PFC converter control method provided by the above embodiment, adjacent minimum frequency points of the PFC carrier frequency function respectively correspond to a zero-crossing point phase of the voltage of the alternating current of the electrical grid and an adjacent peak point phase of the voltage of the alternating current of the electrical grid, and a maximum frequency point of the PFC carrier frequency function corresponds to a preset phase between the zero-crossing point phase and the peak point phase, where an amplitude of a ripple current at the preset phase is the largest.

Due to an amplitude of a power supply voltage near the zero-crossing point phase of the voltage of the alternating current of the electrical grid is low, when the PFC converter is used to increase an output voltage of the power supply, a larger boosting rate is needed, and the chopper waveform of the PFC circuit in the PFC converter has a large duty cycle close to 1, which leads to that an off time of the pulse is very short. At this moment, in case lowering the carrier frequency of the modulated signal, that is, controlling the frequency offset value corresponding to the frequency offset function to make that the frequency offset value has a minimum negative value at the zero-crossing point phase of the voltage of the alternating current of the electrical grid, since a direct current (DC) voltage required for the output of the PFC circuit is stable, it can be considered that a duty cycle of the chopper waveform does not change. Correspondingly, the off time of the pulse is prolonged in a same proportion, and the off-pulse is widened, so that the higher harmonic interference power generated is reduced. Since the off time of the pulse is prolonged in the same proportion, the number of switching the pulse is correspondingly reduced. Therefore, by the PFC carrier frequency corresponding to the PFC carrier frequency function provided by some embodiments of the present application, there is a decrease in switching loss, compared with by the fixed carrier frequency.

Similarly, the magnitude of the power supply voltage, near the peak point phase of the voltage of the alternating current of the electrical grid, is higher. When the PFC converter is used to increase the output voltage of the power supply, a smaller boosting rate is needed, and the chopper waveform of the PFC circuit in the PFC converter has a small duty cycle close to 0, which leads to that the on time of the pulse is very short. At this moment, in case lowering the carrier frequency of the modulated signal, that is, controlling the frequency offset value corresponding to the frequency offset function to make that the frequency offset value has a minimum negative value at the peak point phase of the voltage of the alternating current of the electrical grid, since the DC voltage required for the output of the PFC circuit is stable, it can be considered that the duty cycle of the chopper waveform does not change. Correspondingly, the on time of the pulse is prolonged in a same proportion, and the on-pulse is widened, so that the higher harmonic interference power generated is reduced. Since the on time of the pulse is prolonged in a same proportion, the number of switching of the pulse is correspondingly reduced and the switching loss is also reduced, compared to the fixed carrier frequency.

Due to limitations, such as performance of hardware and single-chip microcomputer, the maximum PFC carrier frequency is limited. In some embodiments, the carrier frequency with a fixed frequency is regarded as the highest carrier frequency or a higher carrier frequency when the carrier frequency varies.

When the phase is between the zero-crossing point phase of the voltage of the alternating current of the electrical grid and the peak point phase of the voltage of the alternating current of the electrical grid, the bus current signal controlled by the PFC circuit in the PFC converter is superimposed with a ripple current, and an amplitude of the ripple current is large. In the case where an inductance quantity of an inductor of the PFC circuit, and a storage capacitance of the PFC circuit do not change, increasing the carrier frequency of the modulated signal can effectively reduce the amplitude of the ripple current generated by the chopping waveform corresponding to the bus current signal, thereby reducing the distortion of the current harmonic and improving the power factor. Therefore, the frequency offset value corresponding to the control frequency offset function is controlled to periodically vary with the phase of the voltage of the alternating current of the electrical grid, in order that the maximum frequency point of the PFC carrier frequency function corresponds to the preset phase between the zero-crossing point phase and the peak point phase, and that the amplitude of the ripple current at the preset phase is the largest, therefore effect of the PFC correction is effectively improved and the amplitude of the harmonic component of the harmonic current is reduced.

In summary, in some embodiments of the present application, by controlling the phase of the PFC carrier frequency corresponding to each frequency point of the PFC carrier frequency function to periodically vary with the phase of the voltage of an alternating current of an electrical grid, the two adjacent minimum frequency points of the PFC carrier frequency function respectively correspond to the zero-crossing point phase and the adjacent peak point phase of the voltage of the alternating current of the electrical grid, and the maximum frequency point of the PFC carrier frequency function corresponds to a preset phase where the amplitude of the ripple current is largest between the zero-crossing point phase and the peak point phase, thereby reducing the number of carriers near the zero-crossing point phase and the peak point phase effectively, increasing the off-pulse width near the zero-crossing point and the on-pulse width near the peak point, reducing the higher harmonic interference power, and reducing the total switching loss at the two points. At the same time, the carrier frequency between the zero-crossing point and the peak point is increased, which significantly reduces an amplitude of the superimposed ripple current in the power frequency fundamental current, reduces the harmonic distortion of the bus current signal, and improves the quality of the power supply after corrected by the PFC converter.

In the PFC converter control method provided by the above embodiments, the maximum frequency point of the PFC carrier frequency function corresponds to a midpoint phase between the zero-crossing point phase and the peak point phase.

In some embodiments of the present application, by detecting a phase signal of a voltage of the alternating current of the electrical grid and synchronizing the phase signal with a time signal in a frequency offset function calculation formula, the frequency offset values corresponding to the zero-crossing point phase of the voltage of the alternating current of the electrical grid and the peak point of the voltage of the alternating current of the electrical grid are minimized. After the frequency offset value and the carrier reference frequency are summed, the frequency offset value corresponding to the obtained frequency offset function is minimized. The phase corresponding to the maximum frequency point of the PFC carrier frequency function needs to be determined according to an adopted function. The phase corresponding to the maximum frequency point of the PFC carrier frequency function is the midpoint phase between the zero-crossing point of the voltage of the alternating current of the electrical grid and the peak point of the voltage of the alternating current of the electrical grid.

In the PFC converter control method provided by the above embodiments, with respect to the phase of the voltage of the alternating current of the electrical grid phase corresponding to the minimum frequency point of the PFC carrier frequency function, the minimum frequency point of the PFC carrier frequency function can be adjusted to correspond to a further non-zero-crossing point of the voltage of the alternating current of the electrical grid, according to EMC experimental results. The selection can be made according to a specific experimental case, so as to minimize the amplitude of the higher harmonic power spectrum.

In the PFC converter control method provided by the above embodiments, the maximum frequency point of the PFC carrier frequency function corresponding to the phase of the voltage of the alternating current of the electrical grid, can also be selected according to the experimental results of EMC, so that the amplitude of the ripple current superimposed in the bus current signal controlled by the chopper waveform of the PFC circuit is minimized, and the harmonic current distortion caused by the ripple current is minimized.

In an application process of frequency variation products, the deviation resulting from the hardware circuit of the frequency variation product, including the nonlinearity of the device, the error of the specification parameters and the like, may cause an offset of the optimal phase of the voltage of the alternating current of the electrical grid corresponding to the minimum frequency point and the maximum frequency point. Therefore, the optimal phase of the voltage of the alternating current of the electrical grid corresponding to the minimum frequency point and the maximum frequency point needs to be determined according to an actual experimental result, and is finally determined when the EMC noise reduction effect is the best.

Figure 4:
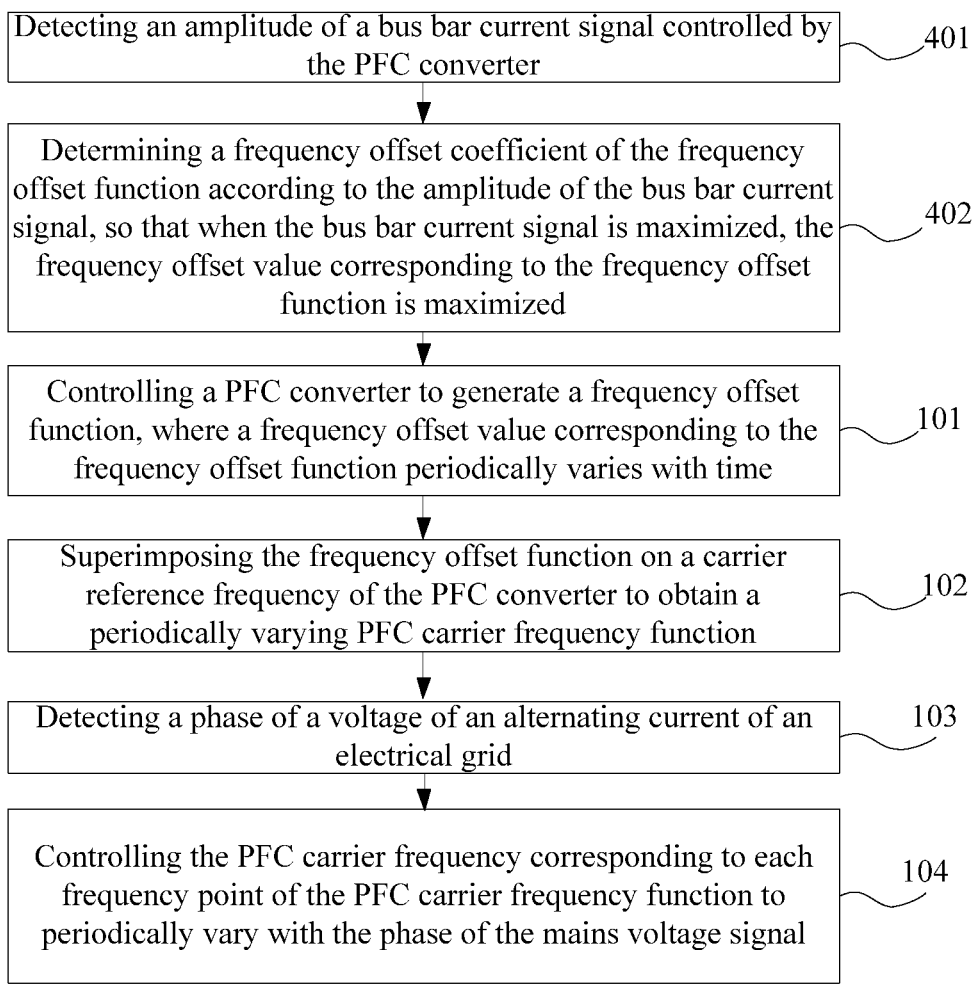
FIG. 4 is a schematic flow diagram of another PFC converter control method provided by some embodiments of the present application.

FIG. 4 is a schematic flow diagram of another PFC converter control method embodiment provided by some embodiments of the present application. This method embodiment is a further description of the PFC converter control method based on the above method embodiments. The executive entity of the method embodiment is also an inverter household appliance. As shown in FIG. 4, before step 101, the PFC converter control method provided by this method embodiment further includes:

Step 401: detecting an amplitude of a bus current signal controlled by the PFC converter.

It can be seen from the above embodiments that the bus current signal controlled by the chopper waveform of the PFC circuit in the PFC converter is superimposed with a ripple current, and when the amplitude of the ripple current is large, serious interference of electromagnetic radiation and the like are generated. Experiments show that, the larger the bus current signal controlled by the chopper waveform of the PFC circuit in the PFC converter is, the larger the amplitude of the ripple current superimposed in the bus current signal is, and the more serious the interference of electromagnetic radiation and the like will become.

Therefore, in some embodiments of the present application, the amplitude of the bus current signal controlled by the PFC converter is detected, and then the frequency offset coefficient corresponding to the frequency offset function is adjusted according to the amplitude of the bus current signal.

Step 402: determining a frequency offset coefficient of the frequency offset function according to the amplitude of the bus current signal, wherein the frequency offset coefficient is configured to make the frequency offset value corresponding to the frequency offset function is maximized when the bus current signal is maximized.

The larger the amplitude of the bus current signal is, the larger the chopper interference will become. Therefore, when the PFC converter operates under a condition with a large current, the frequency offset coefficient of the frequency offset function is increased, so that the frequency offset coefficient corresponds to the bus current amplitude, which may further widen the power spectrum width of the higher harmonic and reduce the power spectral density.

In the PFC converter control method provided by some embodiments of the present application, the amplitude of the bus current signal controlled by the PFC converter is detected before the frequency offset function is generated by the PFC converter, and a frequency offset coefficient of the frequency offset function is determined according to the amplitude of the bus current signal, which allows that when the bus current signal is maximized, the frequency offset value corresponding to the frequency offset function is maximized. Therefore, the electromagnetic interference caused by the large ripple current in the bus current signal is effectively reduced, and the effect of controlling the electromagnetic interference is enhanced.

In some embodiments in the PFC converter control method provided by the above embodiments, the implementation manners for the frequency offset value corresponding to the frequency offset function periodically varying with time, include at least a plurality of various offset manners such as the frequency offset value corresponding to the frequency offset function varying with time periodically and continuously, and the frequency offset value corresponding to the frequency offset function varying with time periodically and intermittently. The following is a brief description for taking the frequency offset value corresponding to the frequency offset function varying with time periodically and continuously and the frequency offset value corresponding to the frequency offset function varying with time periodically and intermittently as an example:

1) When the frequency offset value varies periodically and continuously with time, the PFC carrier frequency function, includes but not limited to: a sine wave function or a triangular wave function.

In the PFC converter control method provided by some embodiments of the present application, when the carrier frequency of the PFC carrier frequency function is controlled to continuously vary in half of the power frequency cycle, the variation law of the frequency offset function may be represented by a common mathematical expression, such as the sine wave function or the triangular wave function. The PFC carrier frequency function which superimposed by the frequency offset function on a carrier reference frequency of the PFC converter can also be a sine wave function or a triangular wave function. However, the frequency offset values generated by different mathematical expressions may have different power spectrum amplitudes, maximum power spectral densities, and power spectrum shapes, resulting in different noise reduction effects correspondingly. The optimal mathematical expression needs to be specifically determined according to experiment effects.

In some embodiments, when the frequency offset function uses the sine wave function, the typical mathematical formula of the obtained PFC carrier frequency function is a sine wave function, as shown in equation (1):

$$F(t)=F_0+A*\sin(4*2\pi*50t-\pi/2) \quad (1)$$

where F(t) is a PFC carrier frequency value corresponding to the PFC carrier frequency function, $F_0$ is a carrier reference frequency, A is the frequency offset coefficient, and t is time.

Figure 5:
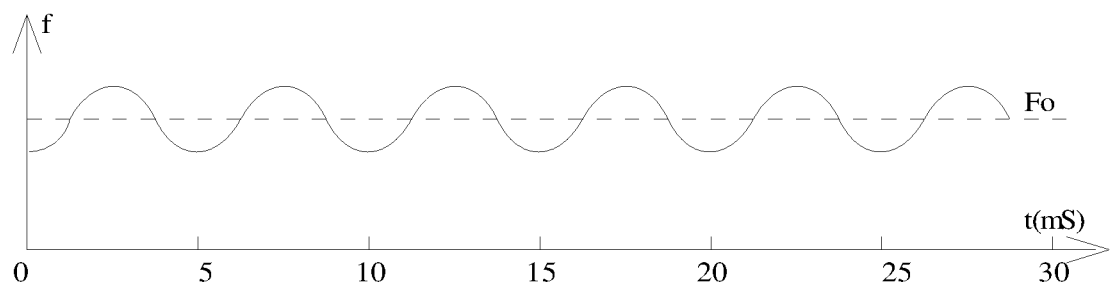
FIG. 5 is a PFC carrier frequency variation curve when a frequency offset function is a sine wave function in some embodiments of the present application.

Correspondingly, when the frequency offset function uses the sine wave function, the obtained PFC carrier frequency variation curve is as shown in FIG. 5. FIG. 5 is a PFC carrier frequency variation curve when the frequency offset function is a sine wave function in some embodiments of the present application.

Figure 6:
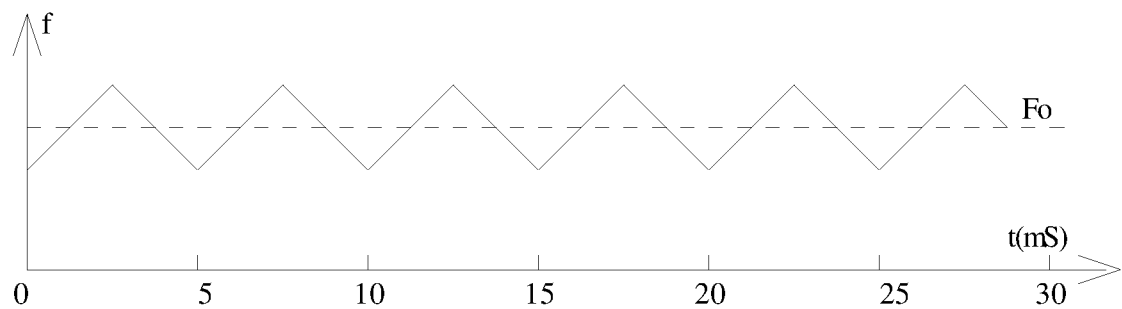
FIG. 6 is a PFC carrier frequency variation curve when a frequency offset function is a triangular wave function in some embodiments of the present application.

The frequency offset function can also use a triangular wave function. When the frequency offset function uses a triangular wave function, the obtained PFC carrier frequency variation curve is as shown in FIG. 6. FIG. 6 is a PFC carrier frequency variation curve when the frequency offset function is a triangular wave function in some embodiments of the present application.

2) When the frequency offset value varies periodically and intermittently with time, the PFC carrier frequency function, includes but not limited to: the stepped-sin wave function.

In some embodiments of the present application, the frequency offset function of the PFC carrier frequency function may use the manner for varying with time intermittently and periodically, in addition to the manner for varying with time continuously and periodically. A typical PFC carrier frequency offset function includes the stepped-sin wave function, when the frequency offset value varies with time intermittently and periodically.

Figure 7:
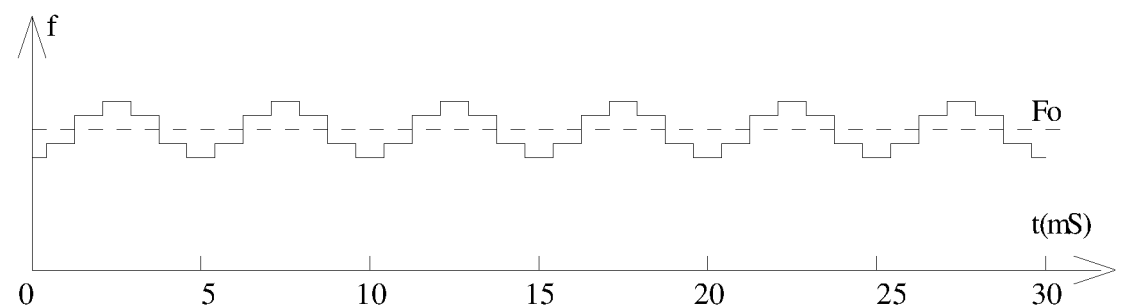
FIG. 7 is a PFC carrier frequency variation curve when a frequency offset function is a stepped-sin wave function in some embodiments of the present application.

When the frequency offset function uses the stepped-sin wave function, the obtained PFC carrier frequency variation curve is as shown in FIG. 7. FIG. 7 is a PFC carrier frequency variation curve when the frequency offset function is a stepped-sin wave function in some embodiments of the present application.

For the mathematical expression corresponding to the frequency offset function, other similar mathematical formulas may also be used, where the mathematical formulas may be used to obtain the PFC carrier frequency by superimposing calculation, thereby realizing the frequency variation control of the PFC carrier. For a specific mathematical expression, some embodiments of the present application may make the selection of the mathematical expressions according to actual needs, which will not be described herein again. Moreover, some embodiments of the present application do not limit the specific expression of the frequency offset function.

The PFC converter control method provided by some embodiments of the present application is applicable not only to a one-path PFC control circuit but also to a multiple-path parallelly connected PFC control circuit.

Figure 8:
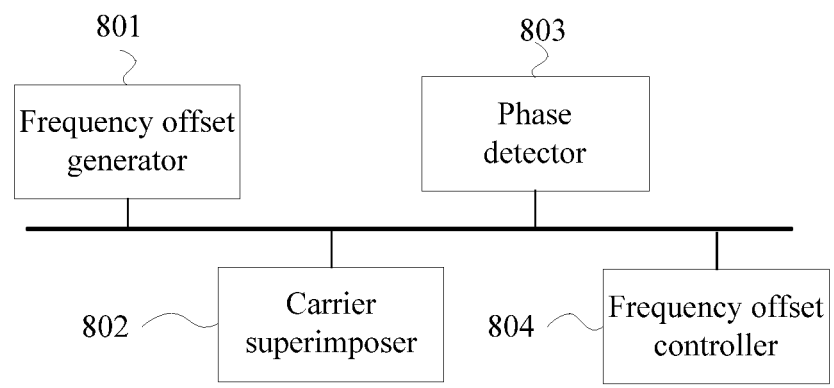
FIG. 8 is a principle schematic diagram of an inverter household appliance provided by some embodiments of the present application.

FIG. 8 is a principle schematic diagram of an inverter household appliance provided by some embodiments of the present application. As shown in FIG. 8, the inverter household appliance includes a frequency offset generator 801, a carrier superimposer 802, a phase detector 803, and a frequency offset controller 804, which are all coupled each other through a bus (shown as a thick line in FIG. 8), where:

the frequency offset generator 801 is configured to generate a frequency offset function, where a frequency offset value corresponding to the frequency offset function periodically varies with time;

the carrier superimposer 802 is configured to superimpose the frequency offset function on a carrier reference frequency of a PFC converter to obtain a periodically varying PFC carrier frequency function;

the phase detector 803 is configured to detect a phase of a voltage of an alternating current of an electrical grid; and the frequency offset controller 804 is configured to control the PFC carrier frequency corresponding to each frequency point of the PFC carrier frequency function to periodically vary with the phase of the voltage.

The inverter household appliance provided by some embodiments of the present application can be used to implement the technical solution of the PFC converter control method embodiment shown in FIG. 1, and the implementation principle and technical effects thereof are similar, details will not be described herein again.

In the inverter household appliance provided by the above embodiments, two adjacent minimum frequency points of the PFC carrier frequency function respectively correspond to a zero-crossing point phase of the voltage of the alternating current of the electrical grid and an adjacent peak point phase of the voltage of the alternating current of the electrical grid. A maximum frequency point of the PFC carrier frequency function corresponds to a preset phase between the zero-crossing point phase and the peak point phase, where an amplitude of the ripple current at the preset phase is the largest.

The maximum frequency point of the PFC carrier frequency function corresponds to a midpoint phase between the zero-crossing point phase and the peak point phase.

FIG. 9 is another schematic diagram of the principle of an inverter household appliance provided by some embodiments of the present application. The inverter household appliance is a further description of the inverter household appliance based on the above embodiments. As shown in FIG. 9, the inverter household appliance further includes a current detector 901 and a frequency offset coefficient determiner 902, which are connected to the frequency offset generator, the carrier superimpose, the phase detector, and the frequency offset controller through the bus (shown as the thick line in FIG. 9).

The current detector 901 is configured to detect an amplitude of a bus current signal controlled by the PFC converter.

The frequency offset coefficient determiner 902 is configured to determine a frequency offset coefficient of the frequency offset function according to the amplitude of the bus current signal detected by the current detector 901, wherein the frequency offset coefficient is configured to make the frequency offset value corresponding to the frequency offset function is maximized when the bus current signal is maximized.

The inverter household appliance provided by some embodiments of the present application can be used to implement the technical solution of the PFC converter control method embodiment shown in FIG. 4, and the implementation principle and technical effects thereof are similar, details will not be described herein again.

In the inverter household appliance provided in the above embodiments, that the frequency offset value corresponding to the frequency offset function periodically varies with time includes: the frequency offset value varies with time continuously and periodically and the frequency offset value varies with time intermittently and periodically.

Where the PFC carrier frequency function, includes: a sine wave function or a triangular wave function; or the PFC carrier frequency function includes a stepped-sin wave function.

The inverter household appliance described in the above embodiment of FIG. 8 or FIG. 9, can be an inverter refrigerator, an inverter washing machine, an inverter dust collector, and the like.

FIG. 10 is a schematic flow diagram of a PFC converter control method for an inverter household appliance provided by some embodiments of the present application. As shown in FIG. 10, the PFC converter control method provided by the method embodiment includes:

Step 1001: generating, by the inverter household appliance, a PFC carrier frequency function based on a carrier reference frequency of an PFC converter, wherein the PFC carrier frequency function is periodically varying, and a variation of the PFC carrier frequency function is a periodically triangular wave variation;

Step 1002: detecting, by the inverter household appliance, a phase of a voltage of an alternating current of an electrical grid; and Step 1003: controlling, by the inverter household appliance, a PFC carrier frequency of the PFC converter to vary with the phase of the voltage according to the PFC carrier frequency function.

In some embodiments, two adjacent minimum frequency points of the periodically varying PFC carrier frequency function respectively correspond to a zero-crossing point of the voltage and an adjacent peak point of the voltage, and a maximum frequency point between the two adjacent minimum frequency points of the periodically varying PFC carrier frequency function, corresponds to a midpoint between the zero-crossing point and the peak point.

In some embodiments, wherein a carrier frequency corresponding to a maximum frequency point of the PFC carrier frequency function is equal to or more than a carrier frequency with a fixed frequency of the PFC converter.

In some embodiments, step 1001, includes:

generating, by the inverter household appliance, a frequency offset function, wherein a frequency offset value corresponding to the frequency offset function periodically varies with time;

superimposing, by the inverter household appliance, the frequency offset function on a carrier reference frequency of the PFC converter to obtain the PFC carrier frequency function.

In some embodiments, before step 1001, the method further includes:

detecting, by the inverter household appliance, an amplitude of a bus current which is controlled by the PFC converter; and determining, by the inverter household appliance, a frequency offset coefficient of the frequency offset function according to the amplitude of the bus current signal, the frequency offset coefficient is configure to make the frequency offset value corresponding to the frequency offset function is maximized when the bus current signal is maximized.

In some embodiments, step 1001, includes generating, by the inverter household appliance, the frequency offset function, according to the frequency offset coefficient, wherein the frequency offset value corresponding to the frequency offset function periodically varies with time.

The PFC converter control method, the inverter household appliance, and the PFC converter control method for an inverter household appliance are provided by some embodiments of the present application, where the method, by superimposing an adjustable frequency offset function on the carrier reference frequency of the voltage of the alternating current of the electrical grid, enables that the PFC carrier frequency centers around the PFC carrier reference frequency and periodically varies within a certain frequency range, thus effectively reducing an amplitude of the highest interference power spectrum detected during a test process, and achieves the purpose of reducing both the electromagnetic radiation and electromagnetic conduction interference level of the high frequency PFC. In some embodiments, by controlling the frequency offset value corresponding to the frequency offset function to periodically vary with the phase of the voltage of the alternating current of the electrical grid, the minimum frequency points of the PFC carrier frequency function respectively correspond to the zero-crossing point phase of the voltage of the alternating current of the electrical grid and the peak point phase of the voltage of the alternating current of the electrical grid, and the maximum frequency point of the PFC carrier frequency function corresponds to a phase where the amplitude of the ripple current is largest between the zero-crossing point phase and the peak point phase. The number of carriers near the zero-crossing point phase and near the peak point phase is reduced, the losses of the on-pulse and the off-pulse are reduced, while the interference power is reduced. In some embodiments, the amplitude of the ripple current in the power frequency fundamental current is significantly reduced, the harmonic distortion of the bus current signal is reduced, and the quality of the power supply after corrected by the PFC converter is improved.

It will be understood by those skilled in the art that all or part of the steps for implementing the above method embodiments may be performed by hardware related to the program instructions. The aforementioned program can be stored in a computer-readable storage medium. The program, when executed, performs the steps including the above method embodiments; and the above storage medium includes various medium that can store program codes, such as a ROM, a RAM, a magnetic disk, or an optical disk.

Finally, it should be noted that the above embodiments are only used to explain the technical solutions of the present application, and are not limited thereto; although the present application has been described in detail with reference to the above embodiments, those skilled in the art should understand that the technical solutions described in the above embodiments may be modified, or some or all of the technical features may be equivalently substituted, however, the modifications or substitutions do not make the relevant technical solution depart from the scope of the technical solutions of the embodiments of the present application.

What is claimed is:

1. A power factor correction (PFC) converter control method, comprising:
   controlling a PFC converter to generate a frequency offset function, wherein a frequency offset value corresponding to the frequency offset function periodically varies with time;
   superimposing the frequency offset function on a carrier reference frequency of the PFC converter to obtain a periodically varying PFC carrier frequency function;
   detecting a phase of a voltage of an alternating current of an electrical grid; and
   controlling a PFC carrier frequency corresponding to each frequency point of the PFC carrier frequency function to periodically vary with the phase of the voltage of the alternating current of the electrical grid;
   wherein before the controlling the PFC converter to generate the frequency offset function, the method further comprises:
   detecting an amplitude of a bus current signal controlled by the PFC converter; and
   determining a frequency offset coefficient of the frequency offset function according to the amplitude of the bus current signal, wherein the frequency offset coefficient is configure to make the frequency offset value corresponding to the frequency offset function is maximized when the bus current signal is maximized.

2. The method according to claim 1, wherein two adjacent minimum frequency points of the PFC carrier frequency function respectively correspond to a zero-crossing point phase of the voltage of the alternating current of the electrical grid and an adjacent peak point phase of the voltage of the alternating current of the electrical grid, and a maximum frequency point of the PFC carrier frequency function corresponds to a preset phase between the zero-crossing point phase and the peak point phase, wherein an amplitude of a ripple current at the preset phase is the largest.

3. The method according to claim 1, wherein two adjacent minimum frequency points of the PFC carrier frequency function respectively correspond to a zero-crossing point phase of the voltage of the alternating current of the electrical grid and an adjacent peak point phase of the voltage of the alternating current of the electrical grid, and a maximum frequency point of the PFC carrier frequency function corresponds to a midpoint phase between the zero-crossing point phase and the peak point phase.

4. The method according to claim 1, wherein the frequency offset value corresponding to the frequency offset function periodically varies with time, comprises at least one of: the frequency offset value varies with time periodically and continuously, or the frequency offset value varies with time periodically and intermittently.

5. The method according to claim 1, wherein the PFC carrier frequency function comprises at least one of a sine wave function or a triangular wave function, when the frequency offset value varies periodically and continuously with time.

6. The method according to claim 5, wherein the sine wave function is expressed by the following formula:

$$F(t)=F_0+A*\sin(4*2\pi*50t-\pi/2)$$

wherein F(t) is a PFC carrier frequency value corresponding to the PFC carrier frequency function, F0 is a carrier reference frequency, A is a frequency offset coefficient, and t is time.

7. The method according to claim 1, wherein the PFC carrier frequency function comprises at least a stepped-sin wave function, when the frequency offset value varies with time periodically and intermittently.

8. An inverter household appliance, comprising a frequency offset generator, a carrier superimpose, a phase detector, and a frequency offset controller, which are all coupled each other through a bus, wherein:
   the frequency offset generator is configured to generate a frequency offset function, wherein a frequency offset value corresponding to the frequency offset function periodically varies with time;
   the carrier superimposer is configured to superimpose the frequency offset function on a carrier reference frequency of a PFC converter to obtain a periodically varying PFC carrier frequency function;
   the phase detector is configured to detect a phase of a voltage of an alternating current of an electrical grid; and
   the frequency offset controller is configured to control a PFC carrier frequency corresponding to each frequency point of the PFC carrier frequency function to periodically vary with a phase of the voltage;
   wherein the inverter household appliance further comprises: a current detector and a frequency offset coefficient determiner, which are connected to the frequency offset generator, the carrier superimpose, the phase detector, and the frequency offset controller through the bus, wherein:
   the current detector is configured to detect an amplitude of a bus current signal controlled by the PFC converter; and
   the frequency offset coefficient determiner is configured to determine a frequency offset coefficient of the frequency offset function according to the amplitude of the bus current signal detected by the current detector, wherein the frequency offset coefficient is configure to make the frequency offset value corresponding to the frequency offset function is maximized when the bus current signal is maximized.

9. The inverter household appliance according to claim 8, wherein two adjacent minimum frequency points of the PFC carrier frequency function respectively correspond to a zero-crossing point phase of the voltage of the alternating current of the electrical grid and an adjacent peak point phase of the voltage of the alternating current of the electrical grid, and a maximum frequency point of the PFC carrier frequency function corresponds to a preset phase between the zero-crossing point phase and the peak point phase, wherein an amplitude of a ripple current at the preset phase is the largest.

10. The inverter household appliance according to claim 8, wherein the PFC carrier frequency function comprises at least one of a sine wave function or a triangular wave function, when the frequency offset value varies periodically and continuously with time.

11. The inverter household appliance according to claim 10, wherein the sine wave function is expressed by the following formula:

$$F(t)=F_0+A*\sin(4*2\pi*50t-\pi/2)$$

wherein F(t) is a PFC carrier frequency value corresponding to the PFC carrier frequency function, F0 is a carrier reference frequency, A is the frequency offset coefficient, and t is time.

12. The inverter household appliance according to claim 8, wherein the PFC carrier frequency function comprises at least a stepped-sin wave function, when the frequency offset value varies with time periodically and intermittently.

13. A power factor correction (PFC) converter control method for an inverter household appliance, comprising:
generating, by the inverter household appliance, a PFC carrier frequency function based on a carrier reference frequency of an PFC converter, wherein the PFC carrier frequency function is periodically varying, and a variation of the PFC carrier frequency function is a periodically triangular wave variation;
detecting, by the inverter household appliance, a phase of a voltage of an alternating current of an electrical grid; and
controlling, by the inverter household appliance, a PFC carrier frequency of the PFC converter to vary with the phase of the voltage according to the PFC carrier frequency functions;
wherein the generating, by the inverter household appliance, the PFC carrier frequency function based on the carrier reference frequency of the PFC converter, comprises:
generating, by the inverter household appliance, a frequency offset function, wherein a frequency offset value corresponding to the frequency offset function periodically varies with time:
superimposing, by the inverter household appliance, the frequency offset function on a carrier reference frequency of the PFC converter to obtain the PFC carrier frequency function; and wherein, before the generating, by the inverter household appliance, the frequency offset function, wherein the frequency offset value corresponding to the frequency offset function periodically varies with time, the method further comprises:
detecting, by the inverter household appliance, an amplitude of a bus current which is controlled by the PFC converter; and
determining, by the inverter household appliance, a frequency offset coefficient of the frequency offset function according to the amplitude of the bus current signal, the frequency offset coefficient is configure to make the frequency offset value corresponding to the frequency offset function is maximized when the bus current signal is maximized; and
wherein the generating, by the inverter household appliance, the frequency offset function, wherein the frequency offset value corresponding to the frequency offset function periodically varies with time, comprise:
generating, by the inverter household appliance, the frequency offset function, according to the frequency offset coefficient, wherein the frequency offset value corresponding to the frequency offset function periodically varies with time.

14. The method according to claim 13, wherein two adjacent minimum frequency points of the periodically varying PFC carrier frequency function respectively correspond to a zero-crossing point of the voltage and an adjacent peak point of the voltage, and a maximum frequency point between the two adjacent minimum frequency points of the periodically varying PFC carrier frequency function, corresponds to a midpoint between the zero-crossing point and the peak point.

15. The method according to claim 13, wherein a carrier frequency corresponding to a maximum frequency point of the PFC carrier frequency function is equal to or more than a carrier frequency with a fixed frequency of the PFC converter.

* * * * *